United States Patent [19]

Ward

[11] 3,735,911

[45] May 29, 1973

[54] INTEGRATED CIRCUIT CHIP REPAIR TOOL

[75] Inventor: William C. Ward, Burlington, Vt.

[73] Assignee: International Business Machines Corporation, Armonk, N.Y.

[22] Filed: Apr. 30, 1971

[21] Appl. No.: 139,063

[52] U.S. Cl. ........................228/19, 29/401, 29/498, 29/575, 29/592, 228/6

[51] Int. Cl. ................................................B23k 1/00

[58] Field of Search ........................239/398; 266/15, 266/23; 33/18; 228/4, 5, 6, 8, 9, 19, 13; 29/401, 470, 484, 498, 575, 576, 584, 592, 624, 625, 626

[56] References Cited

UNITED STATES PATENTS

| | | | |
|---|---|---|---|
| 3,672,651 | 6/1972 | Diepeveen | 266/23 |
| 3,452,917 | 7/1969 | Schneider | 228/49 |
| 3,357,091 | 12/1967 | Reissmueller et al. | 29/470 |
| 3,125,803 | 3/1964 | Rich | 29/482 |
| 3,083,291 | 3/1963 | Soffa et al. | 219/158 |
| 3,050,617 | 8/1962 | Lasch, Jr. et al. | 219/85 |

OTHER PUBLICATIONS

The American Society for Metals, "Metals Handbook," 1948 ed., pp. 174, 175, & 181.

*Primary Examiner*—J. Spencer Overholser
*Assistant Examiner*—Robert J. Craig
*Attorney*—Hanifin & Jancin and Howard J. Walter, Jr.

[57] ABSTRACT

An integrated circuit chip repair tool for bonding or removing reflow soldered chips on multi-chip substrates having chip pickup means to move chips toward or away from a substrate, flame heating means to apply a concentrated source of heat to a single chip without overheating adjacent chips, infrared temperature sensing means to measure the temperature of a heated chip and control means responsive to the temperature of the heated chip to automatically discontinue heating by extinguishing the flame and to automatically activate the chip pickup means.

10 Claims, 5 Drawing Figures

INVENTOR
WILLIAM C. WARD

BY Howard J. Walter, Jr.

ATTORNEY

INTEGRATED CIRCUIT CHIP REPAIR TOOL

BACKGROUND OF THE INVENTION

1. Field of the Invention

This invention relates to solder bonding of heat sensitive materials and more particularly to a method and apparatus for precisely and automatically controlling the application of heat to a work piece to most efficiently obtain proper bonding or removal of small heat sensitive elements without overheating the work piece or the surrounding area.

2. Description of the Prior Art

In the electronics industry it has become commonplace to package semiconductor devices in modules containing a dielectric substrate for providing interconnecting circuitry between individual electronic components such as resistors, capacitors, transistors, diodes, etc. With the advent of integrated circuits, it became possible to combine a plurality of active and inactive devices on a single semiconductor element known as a chip. In many applications, the chip may be attached to the substrate by a method known as flip chip solder bonding where interconnecting circuitry on the face of the chip is reflow soldered directly to the substrate. Typically, chip sizes vary from about 0.040 in. square to 0.125 in. square and larger. Increasing sophistication in the semiconductor industry has resulted in the increase in size of individual chips as well as an increase in the number and density of chips mounted on a single substrate. In order to connect circuitry on the chips to external circuits a plurality of contact points on the chip must be accurately aligned to matching points on the substrate. The number of contact points necessary depends upon the size and complexity of the integrated circuit utilized and may be as high as 50 or more. Soldering of the contacts must be uniform, simultaneous and accurate.

A significant problem in the manufacture of integrated circuit modules is the high cost of individual chips. It is no longer economically feasibly to discard modules which contain defective chips or bonds due to the high dollar value of the chips involved, therefore, it has become necessary to devise methods of repairing modules by replacing defective chips without affecting quality of adjacent chips. Other problems including misalignment of chips and defective bonding also require the use of repair techniques. While batch furnace methods are satisfactory to originally bond all chips simultaneously, these methods are not acceptable as repair techniques. Individual chips must be removable without effecting the integrity of adjacent chip bonding or the quality of chip circuitry. An effective repair technique must include a means for applying a concentrated source of heat to an individual chip at such a rate as to not overheat adjacent chip by conduction through the substrate. Various methods of applying a concentrated source of heat to an individual chip have been previously suggested. Typical heat sources include laser, electron beam, infrared, resistence heating, hot gas and flame. All these sources are capable of supplying a sufficient quantity of heat but in practice it has been found that accurate control of the temperature of the chips is extremely difficult due to the varying nature of the diffusion bond between the chips, solder alloy and substrate. Additionally, many sources, for example hot gas, are difficult to apply to a limited area without adversely affecting adjacent chips. In other methods, the heat applied to defective chips is so intense that removed chips are completely destroyed and therefore unavailable for reuse or quality control evaluation purposes. Prior art techniques normally utilize a timed heat application cycle which has also proved to be unsatisfactory.

Another problem in the repair of modules presented by the nature of diffusion bonding alloys in that only a limited number of solder reflow cycles are permissible without destroying the integrity of the metallurgical bond due to diffusion between the solder alloy and the chip or substrate base metallurgy. In order to achieve the maximum number of repair cycles for a single multi-chip substrate, heating techniques such as reflowing all the chips on a substrate in a manner similar to that used to originally bond the chips is unsatisfactory due to the limitation on the number of reflow cycles each chip is capable of safely withstanding.

SUMMARY OF THE INVENTION

It is therefore an object of this invention to provide an apparatus capable of overcoming the above problems of the prior art and to permit application or removal of small heat sensitive elements without adversely affecting the quality of elements in the immediate vicinity thereof.

It is another object of this invention to remove delicate solder bonded semiconductor devices from a substrate without damaging or destroying them.

It is a further object of this invention to reduce the cost of manufacturing integrated circuit modules by providing a method of repairing defective modules.

It is still a further object of this invention to increase the number of repair cycles permissable for a single integrated circuit module.

In accordance with the broad aspects of the present invention the above and other objects are achieved by controlling the application of a concentrated source of heat energy to the surface of a chip for a period of time determined by monitoring the temperature of the chip surface. In the preferred embodiment a modified oxy-hydrogen flame is used as a controllable heat source and an infrared detector is used to measure the temperature of the chip surface. Automatic control means are provided to control application of the flame to the chip surface.

The foregoing and other objects, features and advantages of the invention will be apparent from the following more particular description of the preferred embodiment of the invention, and illustrated by the accompanying drawings.

DESCRIPTION OF THE PREFERRED EMBODIMENT

Figure 1:
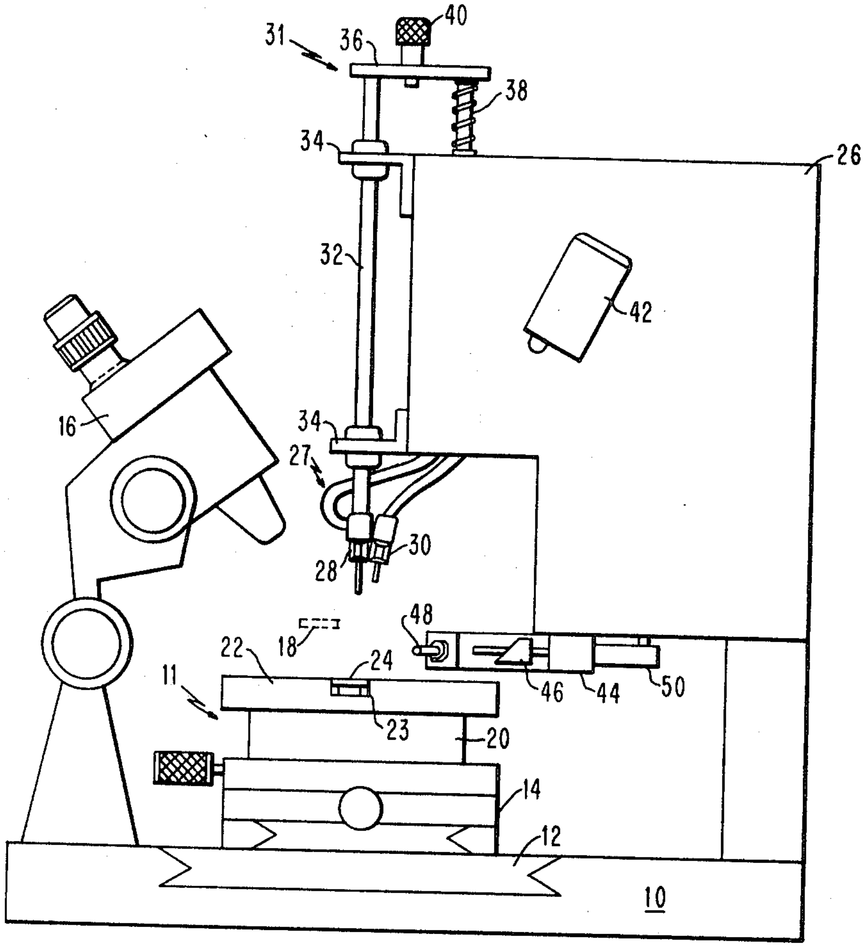
FIG. 1 is a side elevation view of a chip repair tool constructed in accordance with the invention and showing the overall relationship of the various elements of the tool.

Referring to FIG. 1 there is shown a side elevation view of the preferred embodiment of the chip repair tool. There is provided a substrate positioning means 11 including support base 10 upon which is mounted a sliding table 12 used as a macro-positioning stage for rough alignment of integrated circuit substrates 24 under the operative portion of the tool and an *x-y* micro-positioning stage 14 used to obtain final alignment of chip and substrate. Both table 12 and stage 14 may be manually controlled or may be programmed and electrically driven.

A pre-heater 20 of any type well known in the art is provided in order to pre-heat substrates to be repaired. The use of a pre-heater is desirable in order to prevent damage to either chips or substrates by thermal shock and also to reduce cycle time. Selection of the pre-heat temperature is dependent upon the particular device being bonded and should be low enough not to degrade devices by discoloration or otherwise. Mounted directly on top of pre-heater 20 is a plate 22 used to support substrates. A groove 23 may be provided in plate 22 to position substrates. Other configurations of plates might be desirable depending upon the structure of the particular item to be repaired.

Movably mounted on a housing 26 and positioned directly over the substrate positioning means is a probe assembly 27 consisting of a chip pickup means, vacuum probe 28, and a heater means, flame tip 30. A mechanical linkage 31 connects probe assembly 27 to a pneumatic cylinder 64, not shown, described in connection with FIG. 3. The vacuum probe is attached to a plunger rod 32 which is supported in bearings mounted in brackets 34 which enable the probe assembly to move freely up and down vertically toward and away from substrate 24. At the top of rod 32 there is attached a bar 36 which operatively connects plunger rod 32 to an operating rod 38 of pneumatic cylinder 64, not shown. Mounted on bar 36 is a micrometer stop 40 which may be adjusted to limit the travel of the probe assembly in its actuated, or lowered position.

Substrate positioning means 11 is used in conjunction with stereo-microscope 16, which may utilize an alignment reticle superimposed on the image area directly beneath the probe assembly 27 to align connecting pads on integrated circuit chips with a substrate. Alignment may alternately be achieved by the use of a half-silvered mirror 18 to view chip and substrate simultaneously in the manner well known in the art.

A remote temperature sensing means, infrared detector 42, is mounted on the side of housing 26 such that it has an unobstructed view of the particular chip to be heated by flame tip 30. As described more fully in connection with FIG. 3, infrared detector 42 provides part of the control means to automatically operate the probe assembly in order to control the duration of time that heat is applied by heating means, flame tip 30. It is desirable that the temperature detector 42 detect only the temperature of the heated chip and not environmental radiation or radiation emitted from the flame itself. For the particular flame described below, it is preferred to utilize an infrared detector sensitive at about 2.0 – 2.6 microns to avoid detecting the temperature of the flame. If a broad band detector is to be used, filters may be employed to limit the wavelength of light detected. It should also be noted that the light of any system for illuminating the chip or substrate for use in conjunction with microscope 16 should be filtered to avoid masking the infrared emission of the heated chip.

Mounted under housing 26 and adjacent to the probe assembly 27 is a support bracket 44 containing a flame igniter 46 and a flame extinguisher, or puffer, 48. Flame igniter 46 consists of a short piece of platinum resistance wire mounted in a block which may be extended by applying air to cylinder 50. The igniter when extended and energized is used to ignite the flame when the probe assembly is in the lowered position. Puffer 48 is adapted to provide a puff of air to extinguish the flame thereby discontinuing the heating of a chip prior to raising the probe assembly from the lowered position.

Figure 2:
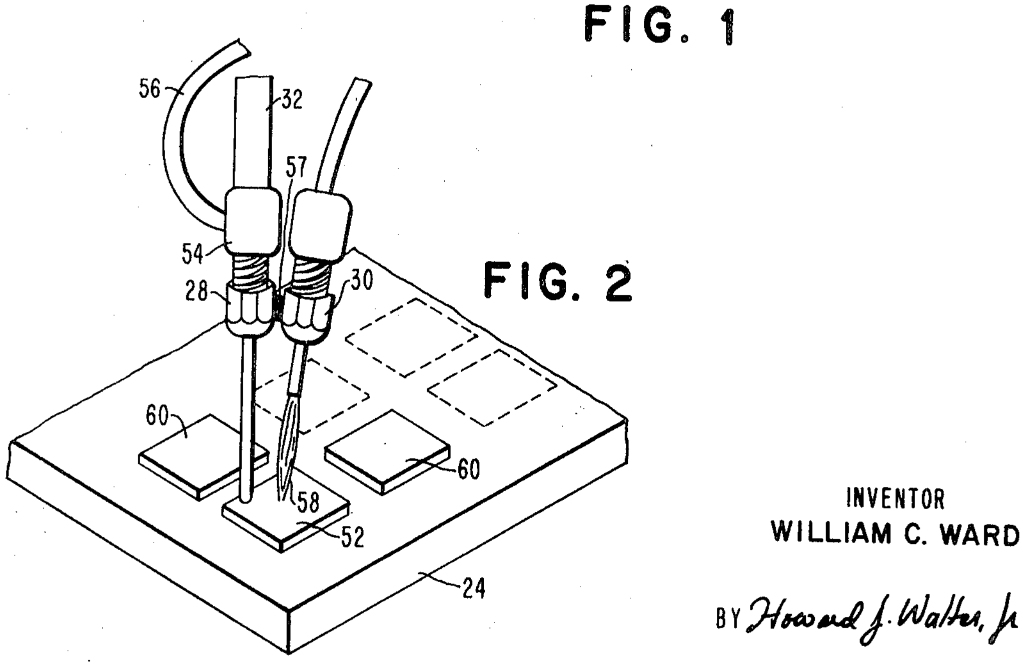
FIG. 2 is an isometric view of the vacuum probe and flame tip showing their relationship to chips on a substrate to be repaired.

Referring now to FIG. 2 there is shown an enlarged view of probe assembly 27 in a lowered position adjacent to a chip 52 to be removed. The probe assembly, as previously described, comprises vacuum probe 28 and flame tip 30. Both the vacuum probe and the flame tip may, for example, be fabricated from hypodermic needles. The sizes of the needles used will depend to some extent upon the size of chips to be bonded or removed. Sizes found useful for integrated circuit work are a 20 gage needle for vacuum probe 28 and a 30 gage needle for flame tip 30. Both should have the tip ground flat. The vacuum probe is mounted on plunger rod 32 by a fitting 54 and connected through hose 56 to either a vacuum or air supply depending upon the particular operation being carried out, as more fully described below in reference to FIG. 3.

Flame tip 30 is welded (57) directly to vacuum probe 28 at a slight angle such that when flame tip 30 is ignited flame 58 does not heat the vacuum tip, as reflected radiation from the hot tip would give erroneous readings of chip temperature.

The preferred gas source for the flame is supplied by an oxy-hydrogen gas generator 78, which will be described in connection with FIG. 3, which produces oxygen and hydrogen from water, mixes the gases automatically in stoichiometric portion, and conducts them to a resevoir where they are bubbled through a bath of acetone or other organic liquid. The addition of acetone, through the burning of carbon, imparts strong carburizing (reducing) characteristics by absorbing atmospheric oxygen in the heated area. As compared with an unmodified oxy-hydrogen flame, the BTU output is increased because of the added heat of combustion of acetone vapor, while the flame temperature is reduced from about 3,000° C to 2,000° C because of the cooler combustion temperature of acetone vapor. In addition the flame becomes longer and more visible to the eye. The location of the end of the flame tip 28, relative to the chip to be heated, depends on a number of factors but may, for example, be about five-sixteenths in. off contact and aimed near the center of the chip. Gas pressure sufficient to produce a flame having a primary cone of about one-eighth in. long may be used.

The use of the modified oxy-hydrogen flame allows a sufficient quantity of heat to be applied to achieve solder reflow in less than 10 seconds while at the same time limiting the temperature rise of adjacent chips 60 through conduction by the substrate 24 such that adjacent chips do not rise to the reflow temperature.

Vacuum probe 28 is positioned over one corner of chip 52 and spaced a few mils off contact. For a chip removal cycle, probe 28 should be sufficiently far from the chip surface such that when reflow occurs the solder or bonding material at the bonding pads will break leaving the chip free to be lifted by vacuum probe 28 and will prevent spiking of the bonding material. In a similar manner during bonding cycles probe 28 should not contact the chip surface. The air space will prevent the tip from acting as a heat sink thereby reducing cycle time and maintaining lower adjacent chip temperatures.

Figure 3:
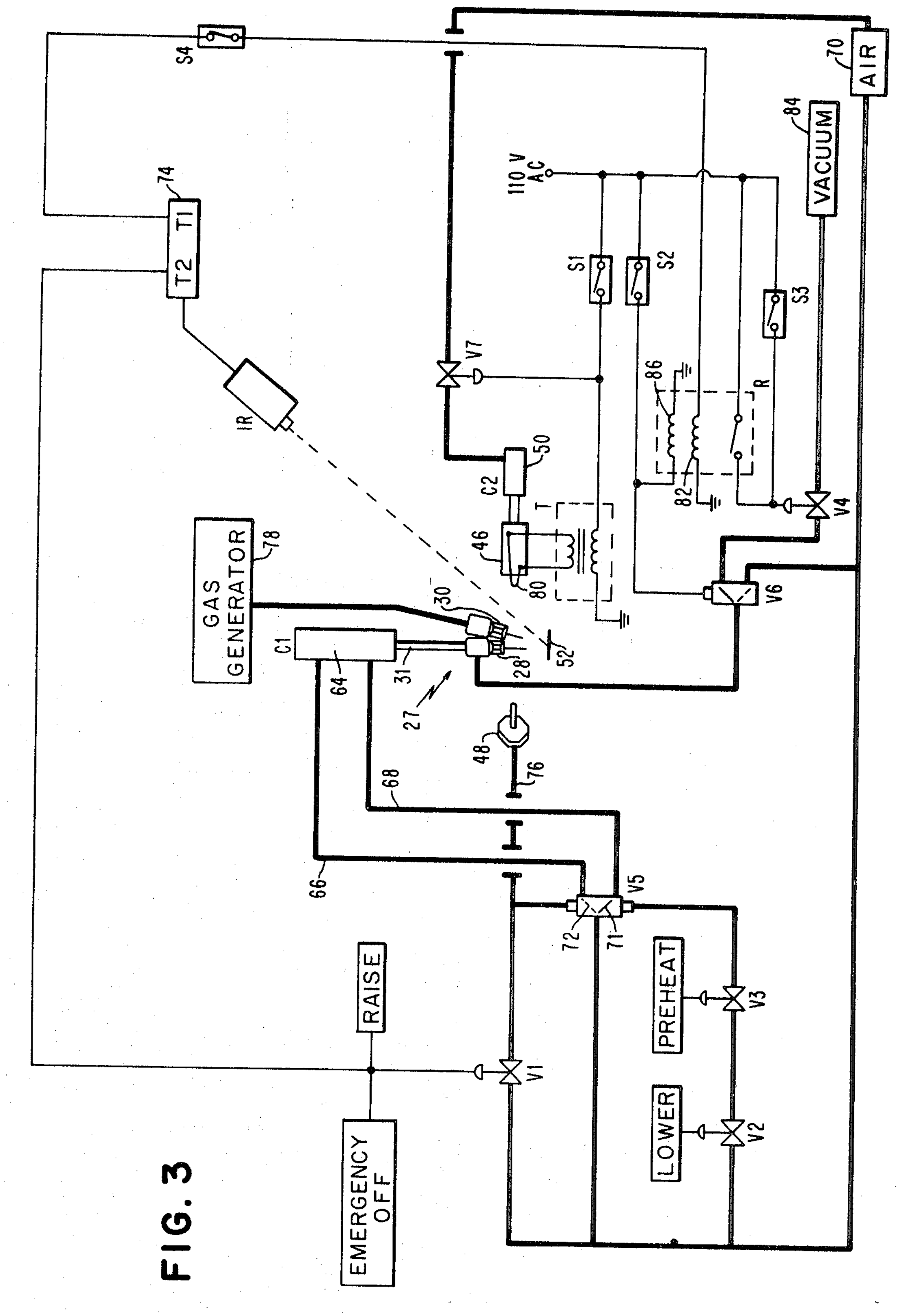
FIG. 3 is a diagramatic view showing the interconnection of the various pneumatic and electrical circuits of the invention.

Referring now to FIG. 3 there is shown diagramatically the pneumatic and electrical circuitry of the preferred embodiment. At the center of the figure probe assembly 27 is for convenience shown attached directly to probe operating cylinder 64 by mechanical linkage 31, referred to previously in the description of FIG. 1. Cylinder 64 is pneumatically actuated and is controlled by valve V5 through air lines 66 and 68. Valve V5 may be a modified four-way spool valve having its input connected to air supply 70 and adapted to connect air supply to either air line 66 or 68. Normally, as shown by the solid line 71, this valve biases cylinder 64 in a raised position. In order to lower the probe assembly spring biased normally closed valves V2 and V3 must be opened. V2 is controlled by manually operating electrical switch LOWER. V3 may be controlled by a thermostatic switch located in pre-heater 20 which prevents operating the tool until the specified pre-heat temperature has been reached. Additionally, pre-heat temperature may be detected by infrared detector 42 and valve V3 controlled by an electrical output of control box 74 to be described shortly. Once both V2 and V3 have been opened V5 is transferred to its second state, indicated by the dashed line 72, which diverts air from line 68 to air line 66 causing the probe assembly 27 to lower. In order to raise the probe assembly there is provided a spring biased normally closed three-way valve V1 which is capable of actuating V5 to cause air from supply 70 to be diverted from line 66 to line 68 thereby raising the probe assembly. V1 may be energized by the output T2 from temperature control box 74 or by manually operated switches RAISE and EMERGENCY OFF. Whenever V1 is actuated, puffer 48 is supplied with air through air line 76 to discontinue heating of the chip by extinguishing the flame from tip 30, if one is present.

Modified oxy-hydrogen gas as described more fully above, is supplied to flame tip 30 from GAS GENERATOR 78.

When probe assembly 27 is in its lowered position flame igniter 46 may be activated. Momentary actuation of manual switch S1 provides current to transformer T and causes spring biased normally closed valve V7 to open. Simultaneously, igniter 46 is extended by air cylinder 50 and current flowing through the secondary winding of T causes wire 80 to glow thereby igniting the flame at tip 30.

As the flame heats chip 52 infrared detector 42 and control box 74 monitor the temperature of the chip. Control box 74 comprises two different threshold detectors adjusted to supply output pulses when the sensed temperature reaches T1 and T2. T1 corresponds to an arbitrarily selected temperature about 30° C to 50° C above the predicted melting temperature of the bonding alloy, or solder, connecting a chip to its substrate. The temperature is selected to allow for a temperature drop across the thickness of chip 52. Output T1 is used only in removing a chip already bonded to a substrate and normally provides the circuit to energize the pick coil 82 of latch contact relay R. This causes spring biased normally closed valve V4 to open thereby connecting vacuum source 84 to vacuum probe 28 through spring biased valve V6. Due to the construction of a latch relay, V4 will remain open until release coil 86 of relay R is energized. Output T2 corresponds to a temperature between T1 and about 100° C above the melting temperature of the bonding alloy and causes V1 to open, as previously described, thereby raising the probe assembly. Temperature T2 is selected such that the temperature of the solder material will be sufficiently in excess of its melting point to provide adequate solder reflow in a bonding operation and to prevent solder spikes from forming on the contact pads of a chip in a removal operation.

In order to positively release a removed chip held by vacuum probe 28 there is provided manual switch S2 which provides the current to energize release coil 86 of latch relay R. Operation of S2 causes valve V4 to close and valve V6 to supply a blast of air to probe 28, thereby, blowing the chip safely away. Released chips may conveniently be caught in a tray, not shown, provided for the collection of removed chips.

Additionally, as more fully described in connection with the discussion of the replacement mode of operation of the tool, there are provided two manual switches, S3 and S4. S3, bypassing relay R, is used to apply vacuum to tip 28 and S4 is used to disable the actuation of the vacuum circuit as controlled by T1.

The integrated circuit chip repair tool of the instant invention may be separately operated in two different modes, remove or replace, or it may be operated to sequentially remove and replace chips on the same chip location of a single substrate. In a manufacturing operation it would be preferable to operate any particular tool in only one mode at a time.

Figure 4:
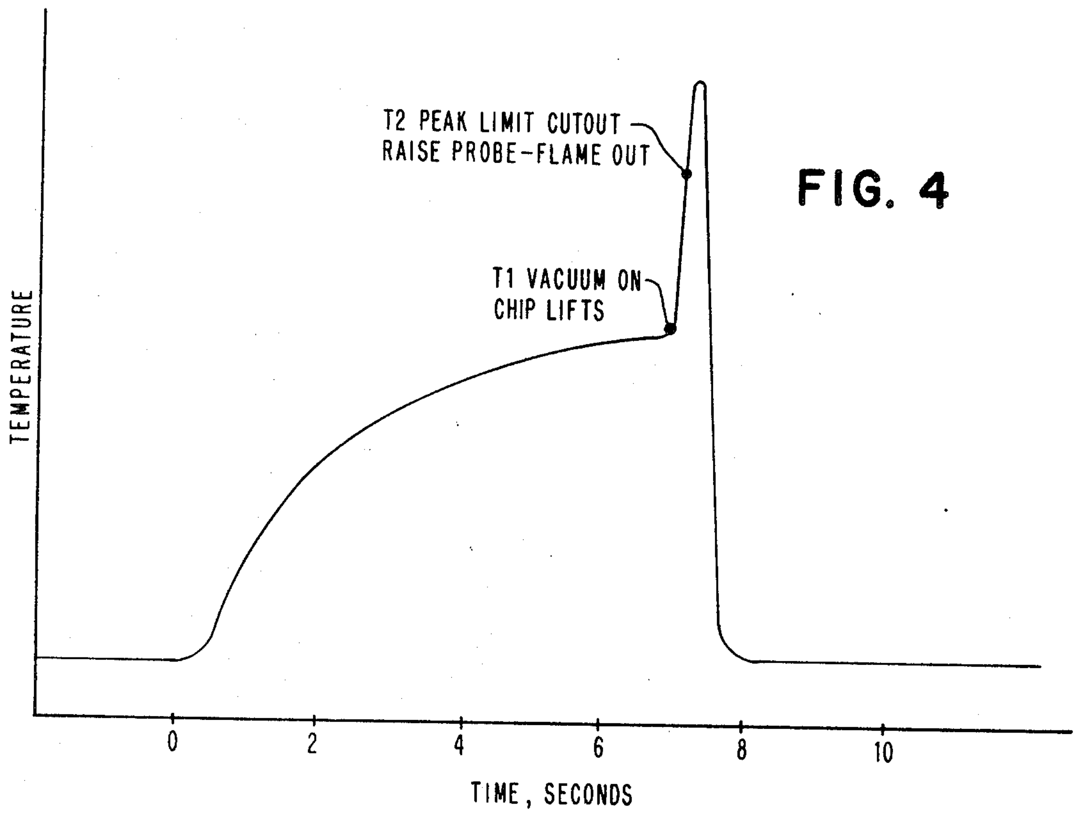
FIGS. 4 and 5 are graphs indicating the time-temperature relationship employed in the method of the invention for removal and replacement of chips, respectively.

In a removal operation, substrate 24 is aligned under probe assembly 27 such that vacuum probe tip 28 is aligned just off contact and over the corner of a chip 52 as described in reference to FIGS. 1 and 2. For alignment purposes the probe assembly 27 may be manually lowered such that the position of vacuum tip 28 may be visually adjusted or an optical system as referred to above may be used. Referring again to FIG. 3, upon actuation of the LOWER control, valve V2 opens, and provided that pre-heat temperature has been reached, valve V5 is actuated allowing air to flow through air line 66 to lower the probe assembly. Manual actuation of switch S1 causes the flame igniter 46 to light the flame which begins the heating cycle. When temperature T1 is reached control box 74 completes the circuit to pick coil 82 of relay R causing valve V4 to apply vacuum to vacuum tip 28. As soon as the chip breaks contact with the substrate the temperature of the chip begins to rise rapidly because of the loss of the use of the substrate as a heat sink. At predetermined temperature T2, as detected by infrared monitor 42, the output T2 of control box 74 causes V1 to open which returns valve V5 to its original position 71 thereby raising probe assembly 27 and chip 52. Simultaneously, puffer 48 extinguishes the flame. Once the probe is in a raised position a chip collection box, not shown, may be positioned under the probe assembly and switch S2 closed. S2 causes relay R to drop to its unoperated state thereby allowing V4 to close and at the same time switching the input of V6 from vacuum supply 84 to air supply 70 causing the chip to drop from the probe. Release of S2 causes V6 to return to its normal position. FIG. 4 shows graphically time-temperature relationship of a removal cycle illustrating the critical measured temperature points which control the automatic operation of the tool.

Figure 5:
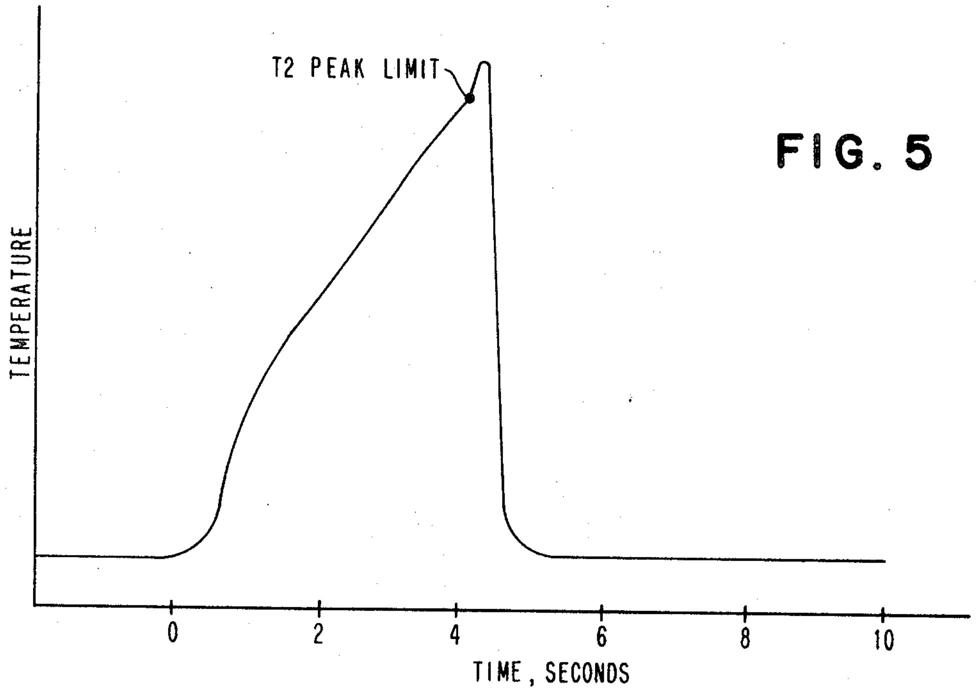

In the replacement operation it is necessary to provide a chip pickup station, not shown, conveniently located for access by vacuum tip 28. The pickup station may be placed on table 12. Chip pickup stations are well known in the art and usually consist of a rotatable table having a mirrored top surface used to view the chip contact pads to obtain proper alignment for placement on a substrate. The probe is manually lowered over the pickup station, as previously described, and switch S3 is closed to apply vacuum to probe 28 thereby picking up the chip. The macro-positioning table 12 is then used to position substrate 24 under probe assembly 27 where the chip pads are aligned with the aid of the microscope 16 and half-silvered mirror 18 by superimposing the reflected image of the chip and the transmitted image of the substrate. Normally closed switch S4 is opened to prevent T1 from activating V4. LOWER control is then operated to cause the probe assembly to lower the aligned chip over the substrate. Thereafter S3 is released closing V4 and allowing the chip to drop into position on the substrate. Switch S1 is then closed to ignite the flame as previously described. At temperature T2 valve V1 is operated as in a removal cycle to complete the operation. FIG. 5 shows the time-temperature relationship of a replacement cycle illustrating the critical measured temperature T2 which controls the automatic operation of the tool.

It should be understood that both removal and replacement cycles may be performed by the single embodiment of the tool as described. Although the preferred embodiment has been described with reference to repairing integrated circuit substrates, it should be understood that the tool has application in any area where a first heat sensitive element must be removed from or bonded to a second element in close proximity to other heat sensitive elements without causing deterioration of either the first element or those surrounding it. It should also be understood that the term solder bonding used throughout the specification and claims refers generally to the method of joining two relatively high melting point materials by adhesion achieved by causing a lower melting point material, or materials, between them to liquefy and thereafter to solidify. Additionally, it will be recognized by those skilled in the art, that the reflow temperature, or melting point, of a solder alloy includes a range rather than a fixed temperature due to the varying metallurgical composition of alloys used, particularly in applications using the solder reflow process.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. Apparatus for controlling the application of heat to achieve solder reflow between a first element and a second element with a solder material comprising:

heating means for applying heat to the first element;

temperature sensing means for sensing the temperature of the first element;

control means responsive to said temperature sensing means for discontinuing application of heat to the first element when a specified temperature above the melting temperature of the solder material is sensed, whereby solder reflow is achieved between the first and second element; and first element removal means responsive to said control means for removing the first element from the vicinity of the second element after solder reflow has occurred.

2. The apparatus of claim 1 wherein the first element is an integrated circuit chip and the second element is a substrate.

3. The apparatus of claim 1 wherein said heating means is a flame.

4. The apparatus of claim 3 wherein said flame is produced from a stoichiometric mixture of hydrogen and oxygen saturated with an organic liquid.

5. The apparatus of claim 4 wherein said organic liquid is acetone.

6. The apparatus of claim 1 wherein said temperature sensing means is an infrared detector.

7. The apparatus of claim 1 wherein said specified temperature is less than 100° C above the melting temperature of the solder material.

8. In an integrated circuit chip repair tool for removing solder bonded chips from a substrate, including substrate positioning means, chip pickup means, and a controllable heat source for applying heat to chips to be removed, the improvement comprising:

temperature sensing means for sensing the temperature of a chip to be removed;

control means responsive to said temperature sensing means for discontinuing application of heat to a chip at a predetermined temperature above the melt temperature of the solder and said control means further controlling the chip pickup means to initiate the removal of the chip from the surface of the substrate.

9. An integrated circuit chip repair tool for repairing multi-chip substrates having a plurality of chips solder bonded thereon adjacent to a chip position to be repaired, comprising:

substrate alignment means for supporting substrates to be repaired;

chip pickup means capable of supporting chips in fixed spaced relation to substrates aligned by said substrate alignment means, said pickup means also capable of moving chips toward and away from said substrate alignment means;

chip heating means for heating chips to a temperature in excess of the melting temperature of the solder bonding material;

extinguishing means for discontinuing the heating of chips by said chip heating means;

temperature detecting means for detecting the temperature of heated chips; and control means responsive to said temperature detecting means for causing said extinguishing means to operate at a first predetermined temperature above the melting temperature of the solder bonding material; said control means additionally enabling said chip pickup means to support chips in fixed spaced relation to a substrate at a second predetermined temperature above the melting temperature of the solder and lower than said first predetermined temperature, whereby a heated chip will be removed from a substrate prior to the time said first predetermined temperature is reached and before the solder bonding adjacent chips to the substrate reaches the melting temperature.

10. The apparatus of claim 9 wherein said chip heating means is a flame and said extinguishing means includes means to provide a puff of air to extinguish said flame.

* * * * *